United States Patent
Iida et al.

(10) Patent No.: US 6,503,825 B1
(45) Date of Patent: *Jan. 7, 2003

(54) METHOD FOR FORMING MULTI-LAYER WIRING STRUCTURE

(75) Inventors: Hiroyuki Iida; Kazuto Ohbuchi; Atsushi Matsushita, all of Kanagawa; Yoshio Hagiwara, Tokyo, all of (JP)

(73) Assignee: Tokyo Ohka Kogyo Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,250

(22) Filed: Feb. 17, 1998

(30) Foreign Application Priority Data

Feb. 28, 1997 (JP) .............................. 9-045649

(51) Int. Cl.⁷ .......................................... H01L 21/4763
(52) U.S. Cl. ..................... 438/623; 438/637; 438/782
(58) Field of Search ................ 438/622, 623, 438/624, 637, 782, 780, FOR 355

(56) References Cited

U.S. PATENT DOCUMENTS

| | | | | |
|---|---|---|---|---|
| 4,634,496 A | * | 1/1987 | Mase et al. ................. | 438/699 |
| 4,673,456 A | * | 6/1987 | Spencer et al. ............. | 156/345 |
| 5,178,957 A | * | 1/1993 | Kolpe et al. ................ | 428/458 |
| 5,252,177 A | * | 10/1993 | Hong et al. ................. | 438/635 |
| 5,399,237 A | * | 3/1995 | Keswick et al. ............. | 216/68 |
| 5,472,488 A | * | 12/1995 | Allman .................. | 106/287.16 |
| 5,665,643 A | * | 9/1997 | Shin ............................. | 438/763 |
| 5,665,845 A | * | 9/1997 | Allman .......................... | 528/8 |
| 5,759,906 A | | 6/1998 | Lou | |
| 5,762,697 A | | 6/1998 | Sakamoto et al. | |
| 5,858,869 A | | 1/1999 | Chen et al. | |
| 5,891,234 A | * | 4/1999 | Koyanagi et al. ...... | 106/287.16 |
| 5,932,487 A | * | 8/1999 | Lou et al. ................... | 438/692 |

FOREIGN PATENT DOCUMENTS

| | | |
|---|---|---|
| EP | 0 443 760 | 8/1991 |
| JP | 8-316228 | 11/1996 |
| JP | 9-64037 | 3/1997 |

* cited by examiner

Primary Examiner—Carl Whitehead, Jr.
Assistant Examiner—Jamie L. Brophy
(74) Attorney, Agent, or Firm—Mercahnt & Gould P.C.

(57) ABSTRACT

For suppressing decomposition of organic group (for example, $CH_3$ group) during ashing process, which is bonded to Si atom of an organic SOG film or layer for use in flattening process, a method comprises following steps: forming an organic SOG layer directly or through a predetermined film including a hillock protection layer on said lower wiring layer; forming said upper wiring layer on said organic SOG layer without processing of etching back; forming a via hole through an etching process by using a patterned resist layer provided on said upper wiring layer as a mask; performing ashing process with a plasma by making ion or radical which is induced from oxygen gas as a main reactant, under an atmosphere of pressure ranging from 0.01 Torr to 30.0 Torr; and burying said via hole with conductive material so as to electrically connect between said lower wiring layer and said upper wiring layer.

3 Claims, 6 Drawing Sheets

(a)

(b)

(a)

(b)

METHOD FOR FORMING MULTI-LAYER WIRING STRUCTURE

BACKGROUND OF THE INVENTION

1. Field of the Invention

The present invention relates to a method for forming multi-layer wiring structure on a semiconductor wafer or on a glass substrate.

2. Description of Related Art

In general, a device being formed on a semiconductor wafer or on a glass substrate has a multi-layer wiring structure, in with which wiring of lower and upper layers are electrically connected through a so-called via hole.

And, under such a multi-layer wiring structure in which only an insulating film or layer lies between the upper wiring layer and the lower wiring layer, an unevenness of the lower wiring layer still remains on the surface of the insulating film or layer, and it causes a cut down of the upper wiring layer which is formed on the uneven surface by a CVD method. Therefore, technologies for flattening are normally applied, by which recesses are filled up with SOG (Spin-On-Glass: silicon oxide film which is formed by coating and baking solution of silicon compound). Among those technologies regarding an inorganic SOG including Si—H chemical bond, it is disclosed in, for example, Japanese Patent Laying-Open No. Hei 8-316,228 (1996).

The SOG, which is disclosed in Japanese Patent Laying-Open No. Hei 8-316,228 (1996), however, is the inorganic SOG including the Si—H chemical bond, therefore, it shows high dielectric constant in comparison with that of an organic SOG, and is easy as to cause cracking due to heat.

The organic SOG does not have the problems that the inorganic SOG has. On the other hand, it is easy to cause a defect which is called "poisoned via" when a resist film is treated by a so-called ashing process by using oxygen gas. Especially in the organic SOG, an organic group (for example, a methyl group ($CH_3$)) is bonded to Si, and the methyl group is larger than hydrogen atom of the inorganic SOG in atomic radius thereof, therefore, it causes serious problems.

Explaining this by referring to FIG. 5 showing a method for forming a multi-layer wiring structure of conventional art, first of all, as shown in FIG. 5(a), after being formed with a lower wiring layer 101 thereon, the substrate W is further formed with a hillock protection film 102 by CVD. Further, as shown in FIG. 5(b), the SOG film 103 is formed on it and thereafter, as shown in FIG. 5(c), an upper wiring layer 104 is formed on the SOG film 103. Further, a patterned resist layer 105 is provided as shown in FIG. 5(d), and as shown is FIG. 5(e), the via hole (or through hole) 106 is formed by using the patterned resist layer 105 as a mask through an etching process on the hillock protection film 102, the SOG film 103 and the upper wiring layer 104. Next, as shown in FIG. 5(f), the patterned resist layer 105 is removed by the ashing process. Furthermore, as shown in FIG. 5(g), conductive material 107 such as aluminum is filled within the via hole 106, thereby electrically connecting between them and constructing the multi-layer wiring structure.

And, in the case that the organic SOG is applied to, as shown in FIG. 5(f), the organic components thereof are decomposed or resolved when the resist layer is treated by the ashing process, and the productions such as water, etc., are stored within the films, thereby causing the defect 108 being called the "poisoned via".

Therefore, a method as shown in FIG. 6, in which the organic SOG is used and an etching back process is necessarily included therein, is applied. Namely, as shown in FIG. 6(a), after being formed with the lower wiring layer 101, the substrate W is further formed with the hillock protection film 102 by the CVD, and further on it is formed the SOG film 103. Next, as shown in FIG. 6(b), the etching back process is treated for removing the organic SOG film 103 by a predetermined thickness with an oxygen plasma, etc., thereby removing the organic SOG film 103 just above the lower layer wiring 101. Thereafter, as shown in FIG. 6(c), the upper wiring layer 109 is formed, and as shown in FIG. 6(d), the patterned resist layer 105 is formed to cover on the upper wiring layer 104. As shown in FIG. 6(e), by treating with the etching process and the ashing process continuously, the via hole 106 is formed on the hillock protection layer 102 and the upper wiring layer 104 as well as removing the resist layer, and further, as shown in FIG. 6(f), the conductive material 107 such as aluminum is filled within the via hole 106, thereby electrically connecting between them and constructing the multi-layer wiring structure.

By treating with the etching back process as shown in FIG. 6, the via hole is not formed in a position where the organic SOG film 103 is located, therefore, the "poisoned via" will not occur.

However, in recent years, a further promoted microscopic processing (for instance, less than 0.3 $\mu$m) is required, and if the wiring pattern is miniaturized, the thickness of the organic SOG becomes thick where the wiring patterns are concentrated or close to each other, while it is thin where the wiring patterns are coarse or rough.

Under such condition, if the organic SOG film is etching backed, there is a disadvantage that even the wiring layer is also removed by the etching process where the wiring patterns are coarse or rough.

SUMMARY OF THE INVENTION

For dissolving the disadvantages mentioned in the above, in accordance with the present invention, there is provided a method for forming multi-layer wiring structure, wherein a lower wiring layer and a upper wiring layer are electrically connected through a via hole, comprising the following steps: forming an organic SOG layer directly or through a predetermined film including a hillock protection layer on said lower wiring layer; forming said upper wiring layer on said organic SOG layer without processing of etching back; forming a via hole through an etching process by using a patterned resist layer provided on said upper wiring layer as a mask; performing an ashing process with a plasma by making ion or radical which is induced from oxygen gas as a main reactant, under an atmosphere of pressure ranging from 0.01 Torr to 30.0 Torr; and burying said via hole with conductive material so as to electrically connect between said lower wiring layer and said upper wiring layer.

By performing the process of making the ion or radical which is induced from the oxygen gas as the main reactant under pressure ranging from 0.01 to 30.0 Torr, preferably, by performing the ashing process under low pressure ranging from 0.01 to 1.2 Torr, it is possible to suppress the decomposition or resolution of the organic group(for example, the $CH_3$ group, etc.) which is bonded to the Si atom of the organic SOG film, and as a result of this, the "poisoned via" and so on will not occur during the ashing process. Accordingly, it can be accomplished without such the etching back.

A carbon content of said organic SOG layer lies between 5 through 25 in atomic weight %, more preferably, between 8 through 20 in atomic weight %. Here, the carbon content can be theoretically calculated from a reaction amount of the alkoxysilane compound for preparing a coating liquid of forming the organic SOG, and it is the ratio of carbon atom weight with respect to the total atomic weight of all elements.

If the carbon content is less than the range mentioned above, since the organic component is too small to thicken the film or layer, it is easy to cause the cracks therein in addition to losing an inherent advantage thereof, i.e., low dielectric constant. On the other hand, if it is too much, it is not preferable since shortage occurs in adhesion between an insulating layer which is provided on an upper layer.

For obtaining the film having the carbon content mentioned in the above, it is preferable to use, for example, a coating liquid containing a compound, which is obtained through hydrolysis and condensation of at least one being selected from alkoxysilane compounds in an organic solvent under existence of an acid catalysis, said compound being expressed by a general equation, $RnSi(OR^1)_{4-n}$, where R is alkyl of carbon number from 1 to 4, or aryl group, $R^1$ is alkyl group of carbon number from 1 to 4, and n is an integer of 1 or 2.

Examples of compounds expressed by the general equation above include:

(a) If n=1, monoalkyltrialkoxysilane including: monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane, monopropyltriethoxysilane, etc., and monophenyltrialkoxysilane including: monophenyltrimethoxysilane, monophenyltriethoxysilane, etc.

(b) If n=2, dialkyldialkoxylsilane including: dimethyldimethoxysilane, dimethyldiethoxysilane, dimethyldipropoxysilane, diethyldimethoxysilane, dimethyldiethoxysilane, diethyldipropoxysilane, dipropyldimethoxysilane, dipropyldiethoxysilane, dipropyldipropoxysilane, etc., and diphenyldialkoxy silane including: diphenyldimthoxy silane, diphenyldiethoxy silane, etc. It is necessary to use at least one kind from (a) and (b).

If desired, as other compounds which can be condensed with the (a) and (b), in case that n=0 of the compound, namely, it is also effective to use (c) tetraalkoxysilane, including tetramethoxysilane, tetraethoxysilane, tetrapropoxysilane, tetrabutoxysilane, etc.

Among those, the compounds preferable from practical view point are tetramethoxysilane, tetraethoxysilane, monomethyltrimethoxysilane, monomethyltriethoxysilane, dimethyldimethoxysilane, and dimethyldiethoxysilane.

It is possible to use only one of those alkoxylsilane compounds, or two or more being selected from them.

Regarding mol ratio of reaction in case that the two kinds of the (a) and (c) are combined, upon 1 mol of (c) tetraalkoxysilane is reacted 0.5–4.0 mol of (a) monoalkyltrialkoxysilane, more preferably, by reacting 1.0–2.0 mol of (a), thereby obtaining a desirable coating liquid containing a product obtained through hydrolysis and condensation thereof.

Further, when combining three kinds of the (a), (b) and (c), upon 1 mol of (b) dialkyldialkoxysilane are reacted 0.5–4 mol of (c) tetraalkoxysilane and 0.5–4 mol of the (a) monoalkyltrialkoxysilane, more preferably, by reacting 1.0–3.0 mol of the (c) and 0.5–3.0 mol of the (a), thereby obtaining a desirable coating liquid containing a product obtained through hydrolysis and condensation thereof.

Further, in case of only the (a) monoalkyltrialkoxysilane, it is likely to obtain a ladder type of product obtained through the hydrolysis and condensation, and the product of that ladder type is preferable to form a fine film.

Hydrolysate obtained with the hydrolysis can be one which is completely hydrolyzed or which is partially hydrolyzed. A degree of the hydrolysis can be adjusted by an amount of water to be added, therefore, the amount of water to be added is adjusted appropriately depending on characteristics of the organic SOG intended. In general, it is desired that upon total amount of 1 mol of alkoxysilane, which is used to prepare the coating liquid, the water is reacted at ratio of 1.0–10.0, mol more preferably at ratio of 1.5–8.0 mol thereof. If it is too much lower than this range, the degree of hydrolysis becomes too low and it becomes difficult to form the film. Further, if it is too much higher than that, gelation or gel formation can occur, therefore, which is not preferable since it results in bad stability for the purpose of preservation thereof.

Further, with the acidic catalyst, both organic acid or inorganic acid, which have been commonly used in conventional art, can be used. The organic acid can be an organic carboxylic acid including such as acetic acid, propionic acid, butyric acid, etc. The inorganic acid can include such as hydrochloric acid, nitric acid, sulfuric acid, phosphoric acid, etc.

In this case, the acidic catalyst is added into the coating liquid in such a manner that concentration of acid lies within a range of 1–1,000 ppm, more preferably 5–500 ppm, or is added in a form of acidic water solution mixing the acid and water to be added, thereby obtaining hydrolysis.

The hydrolysis completes the reaction thereof normally within 5–100 hours. Further, the reaction can be completed in a short reaction time by heating it, at a temperature from room temperature up to 80° C. and by dropping the water solution of acidic catalyst into an organic solvent containing the alkoxysilane for the reaction thereof. The alkoxysilane compound which is hydrolyzed in this manner causes condensation reaction, and as a result thereof, it obtains an ability to be formed in a form of a film or layer.

As the organic solvent, various organic solvents which have been commonly used in conventional art, can be used. Examples of such solvents include monohydric alcohol, including such as methyl alcohol, ethyl alcohol, propyl alcohol, butyl alcohol, etc.; polyhydric alcohol, including such as ethylene glycol, diethylene glycol, propylane glycol, etc.; polyhydric alcohol derivative, including such as ethylene glycol monomethyl ether, ethylene glycol monoethyl ether, ethylene glycol monopropyl ether, ethylene glycol monobutyl ether, propylane glycol monomethyl ether, propylane glycol monoethyl ether, propylane glycol monopropyl ether, propylane glycol monobutyl ether, ethylene glycol monomethyl ether acetate, ethylene glycol monoethyl ether acetate, propylane glycol monomethyl ether acetate, propylane glycol monoethyl ether acetate, etc.; and fatty acid, including such acetic acid, propionic acid, etc. Those respective organic solvents can be used not only one by one, but also used in combination thereof, selecting more than 2 from them. With amount of them to be used, at a ratio of 10–30 mol of them is used upon 1 mol of alkoxysilane.

Further, in accordance with the method for forming a muiti-layer wiring structure of the present invention, the preferable result can be obtained with the SOG film which is formed from a coating liquid including polysilazane.

With the polysilazane, it is preferable that it lies in a range 1500–5000 in average molecular weight (Mw) of polystyrene conversion, which is measured by gel permeation chromatography (GPC), in particular within a range 1,700–3,000. Furthermore, it is preferable that dispersion (Mw/Mn) lies within a range from 1 to 4, since it shows good stability for preservation.

In particular, the polysilazane has an active organic group inside (hydrogen atom which is bonded to nitrogen atom and silicon atom), therefore, it is easy to cause bridge-building or chemical cross-linking to increase viscosity, or gelation. For preventing this, it is preferable to be processed with hexamethyle disilazane to replace a part of the active hydrogen with trimethy, since it has good stability for preservation.

As the solvent for dissolving the polysilazane, from view points of fire fighting, dryness and stability for preservation, it is preferable that it is low in hygroscopic character. Such compound can include dialkylether of alkyl group of carbon number more than 4, xylene, cyclohexane, dimethylcyclohexane, ethylcyclohexane, p-menthane, decalin, 2,2,5-trimethylhexane, dipentene, decane, isononane, octane, etc. Among those, dialkylether of carbon number more than 4 is preferable, and in particuar, dibutylether is preferable. Those respective organic solvents can be used not only one by one, but also used in combination of, selecting more than 2 from them.

The coating liquid for forming the organic SOG film, or the coating liquid containing the polysilazane, in accordance with the present invention, is preferable to have the hydrolysate of the above-mentioned alkoxysilane or the polysilazane at a concentration of 5–40 weight % of solid body, more preferably 10–25 weight %, so as to achieve a stability for preservation and to thicken a film to be formed.

Further, in the method for forming the organic SOG film, the above-mentioned coating liquid is coated on a substrate of a semiconductor substrate, a glass substrate, a metal substrate, a ceramic substrate, etc., by means of a so-called spinner method, a roll coating method, an immersion coating method, a spray method, a screen printing method, a brush painting method, etc., and it is dried to scatter or evaporate the solvent therein, thereby the coating film is formed. Then, it is baked at the temperature of 250–500° C., thereby the organic SOG film being formed.

On the other hand, with the method for forming the SOG film which is formed from the coating liquid containing the polysilazane, it is also formed in a similar manner to that mentioned in the above.

DESCRIPTION OF THE PREFERRED EMBODIMENTS

Hereinafter, detailed explanation of the embodiments according to the present invention will be given by referring to attached drawings.

EXAMPLE 1

Preparation of Coating Liquid 246 g (1.62 mol) of tetramethoxyilane and 220 g (1.62 mol) of monomethyltriethoxysilane are dissolved and mixed into propyleneglycolmonopropylether of 635 g (5.38 mol). Next, a mixture of 194 g (10.78 mol) of purified water and 24 ppm of nitric acid is dropped in it and stirred slowly for about 5 hours. Thereafter, it is left standing still for 5 days in a room temperature so as to obtain a solution, at 15 weight % of solid state concentration thereof.

As a coating liquid, the solution mentioned in the above is coated on the hillock protection film covering a lower wiring layer on the substrate, thereby forming an organic SOG film. The carbon content in the organic SOG film is obtained by a following equation, and is 9.4 atomic weight %:

$$C/(CH_3SiO_{3/2}+SiO_2)\times 100$$

Then, on this organic SOG film is formed an upper wiring layer without performing the etching back, and further the via hole is formed with etching by using the patterned resist layer as the mask. Thereafter, with use of a plasma ashing apparatus of a leaf type and a down-stream type, ashing process is treated so as to remove the resist film, by making ion or radical which is induced from oxygen gas as a main reactant, under an atmosphere of pressure of 1.2 Torr. Thereafter, the via hole is buried with a conductive material so as to electrically connect between the lower layer wiring and the upper layer wiring.

Figure 1:
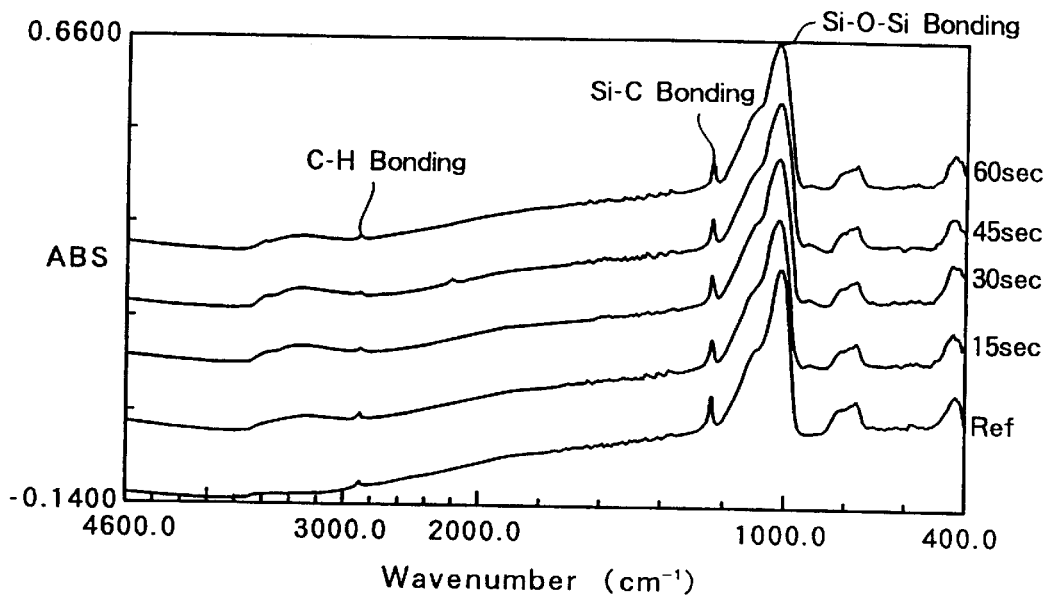
FIG. 1(a) shows a graph of infrared absorption spectrum when being treated by ashing process for a predetermined time period under atmospheric pressure of 1.2 Torr by using a plasma ashing apparatus of leaf and down-stream type or model.
FIG. 1(b) shows a graph of infrared absorption spectrum when being treated by the ashing process for a time period of 30 second under a predetermined atmospheric pressure by using the same apparatus.
Figure 1:
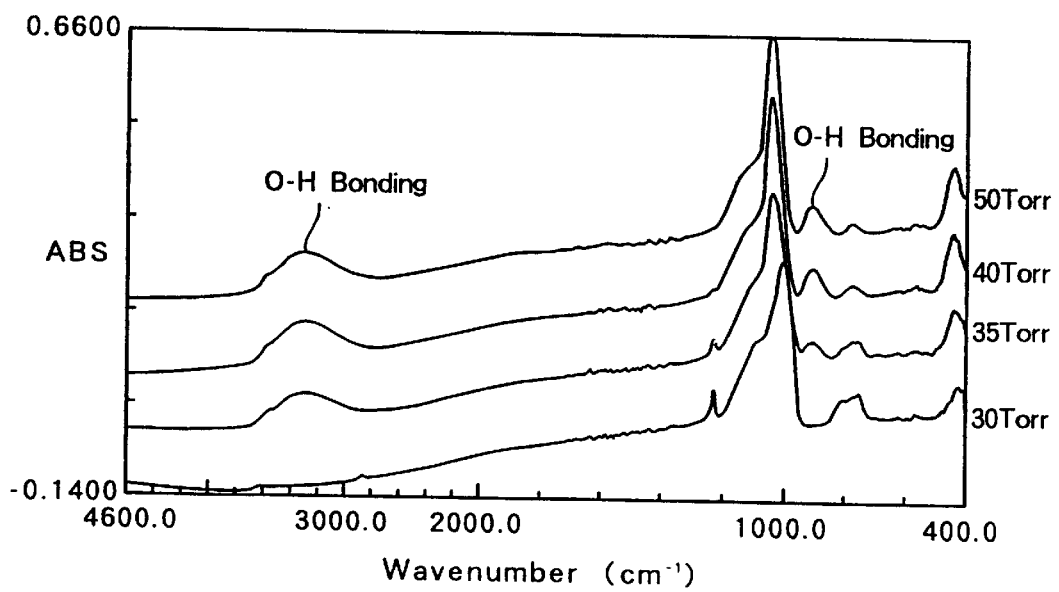

FIG. 1(a) shows the infrared absorption spectrums which are obtained by changing the time period of the above-mentioned ashing process, sequentially, froma curve at a top thereof, i.e., 60 seconds, 45 seconds, 30 seconds, 15 seconds and no processing. From this drawing, it is apparent that Si—C bonding is not broken, in the case of the present invention.

On the other hand, FIG. 1(b) shows the infrared absorption spectrums which are obtained through the ashing process for 30 seconds by using the same plasma ashing apparatus, by changing the pressure, i.e., 50 Torr, 40 Torr, 35 Torr and 30 Torr, from a curve at a top thereof, sequentially, though the same condition as mentioned in the above is applied until forming the via hole by treating the etching process. From this drawing, it is apparent that Si—C bonding is broken if the pressure during the ashing process is high, and OH bonding is caused.

EXAMPLE 2

Preparation of Coating Liquid 304.2 g (2 mol) of tetrimethoxysilane 272.4 g (2 mol) of monomethyltrimethoxysilane and 120.2 g (1 mol) of dimethyldimethoxysilane are dissolved and mixed into 608.6 g (8.21 mol) of isopropyl alcohol. Next, a mixture of 288.0 g (16 mol) of purified water and 40 ppm of nitric acid is dropped in it and stirred slowly for about 5 hours. Thereafter, it is left standing still for 5 days in a room temperature so as to obtain a solution, at 16 weight % of solid state concentration thereof.

As a coating liquid, the solution mentioned in the above is coated on the hillock protection film covering a lower wiring layer on the substrate, thereby forming an organic SOG film. The carbon content in the organic SOG film is obtained by a following equation, and is 14.6 atomic weight %:

$$3C/[(CH_3)_2SiO_{2/2}+CH_3SiO_{3/2}+SiO_2)]\times 100$$

Then, on this organic SOG film is formed an upper wiring layer without conducting the etching back in the same manner as in the above, and further the via hole is formed with etching by using the patterned resist layer as the mask. Thereafter, using the plasma ashing apparatus of a leaf type and a down-stream type, ashing process is treated so as to remove the resist film, by making ion or radical which is induced from oxygen gas as a main reactant, under an atmosphere of pressure of 1.0 Torr. Thereafter, the via hole is buried with a conductive body so as to electrically connect between the lower layer wiring and the upper layer wiring.

Figure 2A:
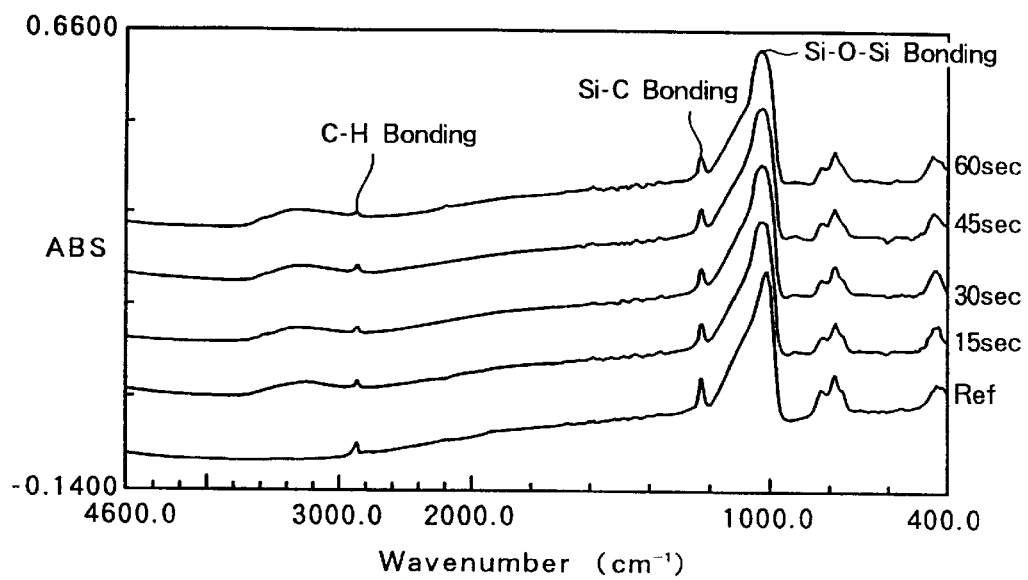
FIG. 2(a) shows a graph of infrared absorption spectrum when being treated by ashing process for a predetermined time period under atmospheric pressure of 1.0 Torr by using a plasma ashing apparatus of leaf and down-stream model.

FIG. 2(a) shows the infrared absorption spectrums which are obtained by changing the time period of the above-mentioned ashing process, sequentially, from a curve at a top thereof, i.e., 60 seconds, 45 seconds, 30 seconds, 15 seconds and no processing. From this drawing, it is apparent that Si—C bonding is not broken, in the case of the present invention.

Figure 2B:
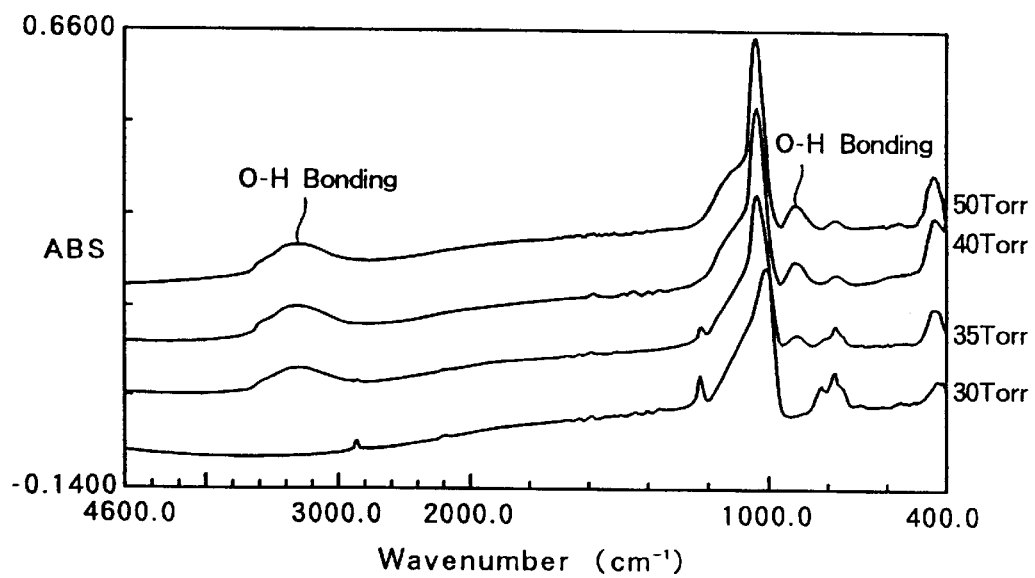
FIG. 2(b) shows a graph of infrared absorption spectrum when being treated by the ashing process for a time period of 30 second under a predetermined atmospheric pressure by using the same apparatus.

On the other hand, FIG. 2(b) shows the infrared absorption 1.0 spectrums which are obtained through the ashing process for 30 seconds by using the same plasma ashing apparatus, by changing the pressure, i.e., 50 Torr, 40 Torr, 35 Torr and 30 Torr, from a curve at a top thereof, sequentially, though the same condition as mentioned above is applied until forming the via hole by treating the etching process. From this drawing, it is apparent that Si—C bonding is broken if the pressure during the ashing process becomes high, and OH bonding is caused.

EXAMPLE 3

Preparation of Coating Liquid

A solution at 10 weight % in the solid state concentration is used as the coating liquid, in which a ladder type product obtained from monomethyltriethoxysilane through the hydrolysis and the condensation under the existence of acid catalysis is dissolved into ethanol. This coating liquid is coated on the hillock protection film covering a lower wiring layer on the substrate, thereby forming an organic SOG film. Further, the carbon content in the organic SOG film is obtained by a following equation, and is 17.9 atomic weight %:

$$C/[(CH_3)SiO_{3/2}]\times 100$$

Then, on this organic SOG film is formed an upper wiring layer without conducting the etching back in the same manner as in the above, and further the via hole is formed with etching by using the patterned resist layer as the mask. Thereafter, using the plasma ashing apparatus of a leaf type and a down-stream type, ashing process is treated so as to remove the resist film, by making ion or radical which is induced from oxygen gas as a main reactant, under an atmosphere of pressure of 0.8 Torr. Thereafter, the via hole is buried with a conductive body so as to electrically connect between the lower layer wiring and the upper layer wiring.

Figure 3A:
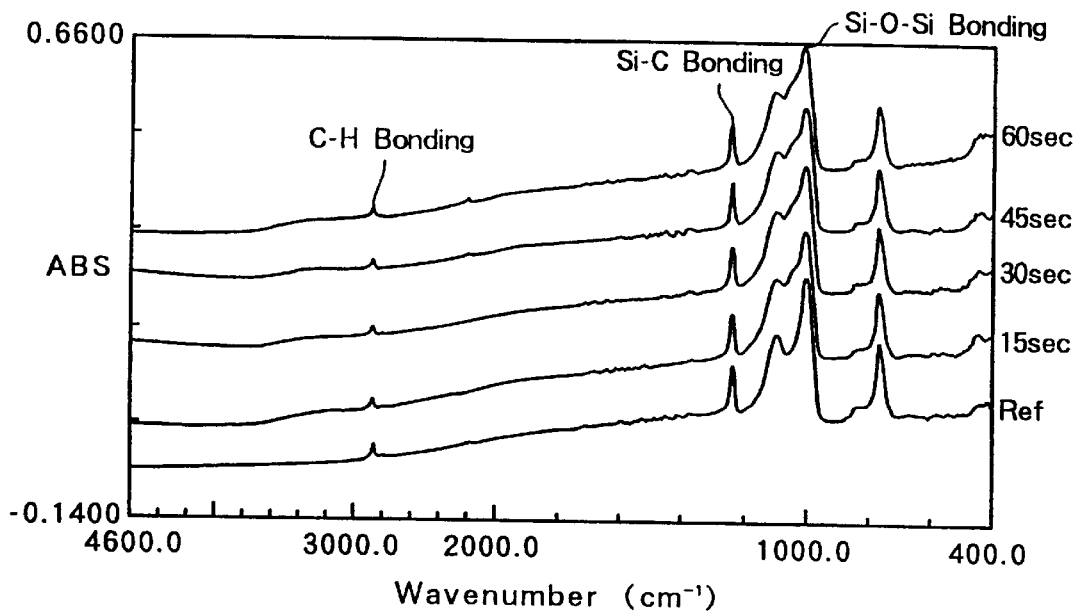
FIG. 3(a) shows a graph of infrared absorption spectrum when being treated by ashing process for a predetermined time period under atmospheric pressure of 0.8 Torr by using a plasma ashing apparatus of leaf and down-stream type.

FIG. 3(a) shows the infrared absorption spectrums which are obtained by changing the time period of the above-mentioned ashing process, sequentially, from a curve at a top thereof, i.e., 60 seconds, 45 seconds, 30 seconds, 15 seconds and no processing. From this drawing, it is apparent that Si—C bonding is not broken, in the case of the present invention.

Figure 3B:
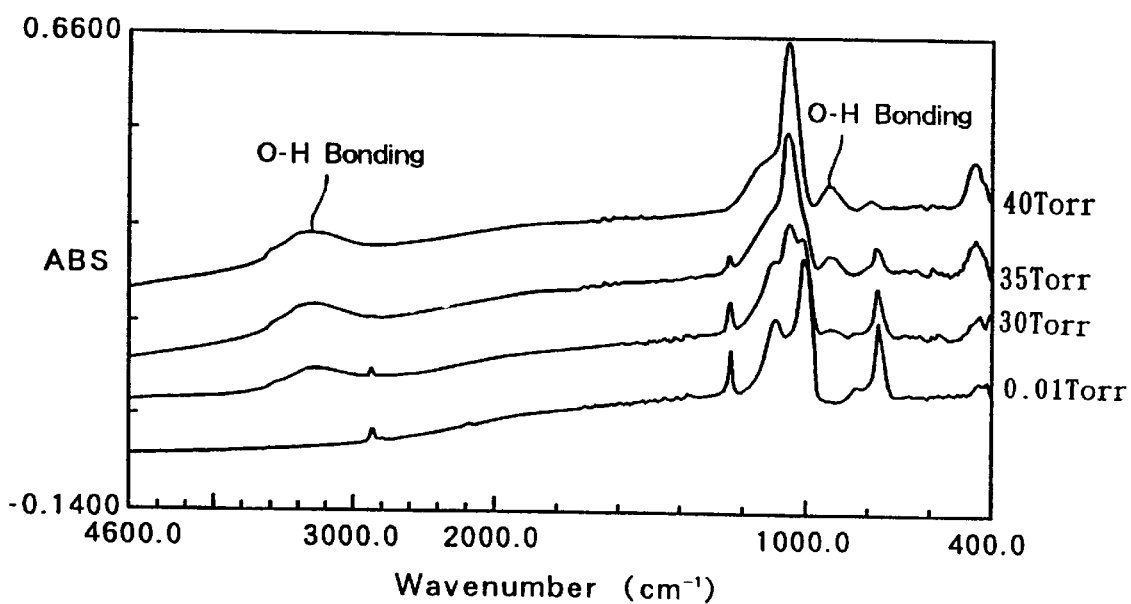
FIG. 3(b) shows a graph of infrared absorption spectrum when being treated by the ashing process for a time period of 20 second under a predetermined atmospheric pressure by using the same apparatus.

On the other hand, FIG. 3(b) shows the infrared absorption spectrums which are obtained through the ashing process for 20 seconds by using the same plasma ashing apparatus, by changing the pressure, i.e., 40 Torr, 35 Torr, 30 Torr and 0.01 Torr from a curve at a top thereof, sequentially, though the same condition as mentioned above is applied until forming the via hole by treating the etching process. From this drawing, it is apparent that Si—C bonding is broken if the pressure during the ashing process becomes high, and OH bonding is caused.

EXAMPLE 4

Preparation of Coating Liquid

A solution at 20 weight % in the solid state concentration is obtained by dissolving into dibutylether a product which is obtained by adding and reacting hexamethyldivilazane upon polysilazane (average molecular weight=2200, average molecular number=950, dispersion=2.3), which is composed from ingredients, i.e., dichrolosilane and ammonia according to an ordinary method. This coating liquid is coated on the hillock protection film covering a lower wiring layer on the substrate, thereby forming a SOG film.

Then, on this SOG film is formed an upper wiring layer without conducting the etching back in the same manner as in the above, and further the via hole is formed with etching by using the patterned resist layer as the mask. Thereafter, using the plasma ashing apparatus of a leaf type and a down-stream type, ashing process is treated so as to remove the resist film, by making ion or radical which is induced from oxygen gas as a main reactant, for 30 seconds, under an atmosphere of pressure of 0.01 Torr. Thereafter, the via hole is buried with a conductive body so as to electrically connect between the lower layer wiring and the upper layer wiring.

Figure 4A:
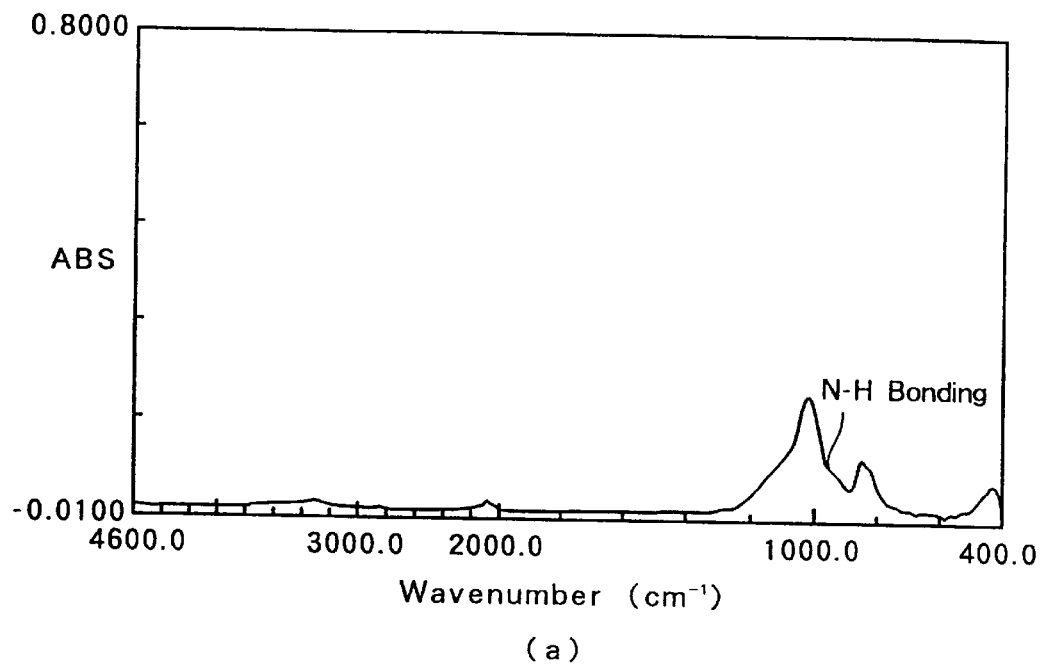
FIG. 4(a) shows a graph of infrared absorption spectrum when being treated by ashing process for a predetermined time period under atmospheric pressure of 0.01 Torr by using a plasma ashing apparatus of leaf and down-stream type.

FIG. 4(a) shows the infrared absorption spectrum after treating with the ashing process, and from this drawing, it is apparent that N—H bonding is not broken, in the case of the present invention.

Figure 4B:
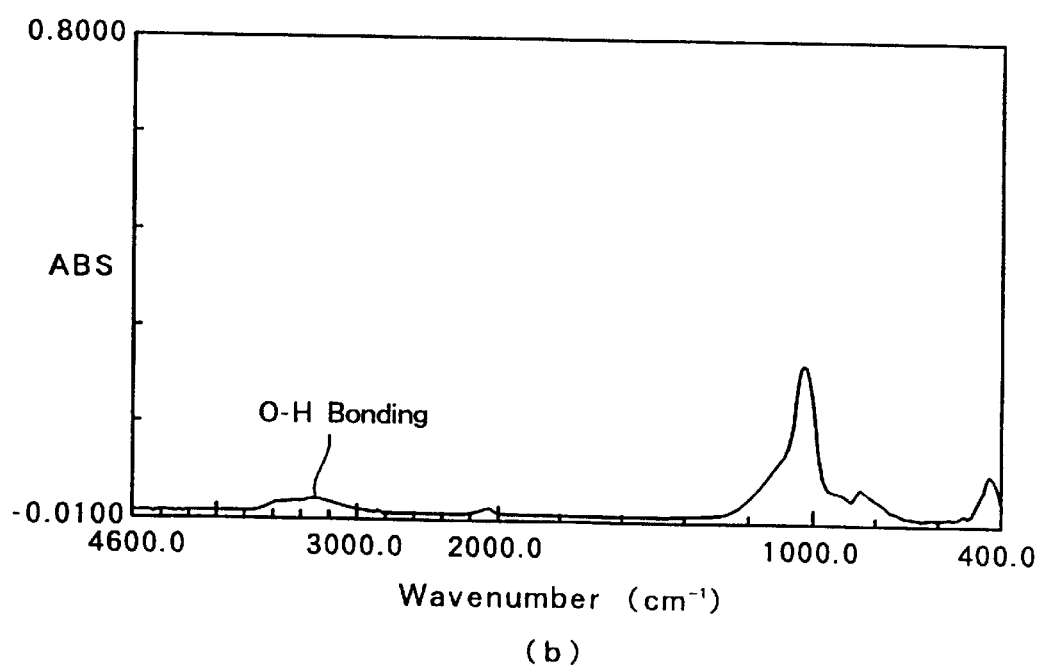
FIG. 4(b) shows a graph of infrared absorption spectrum when being treated by the ashing process for a time period of 30 second under a predetermined atmospheric pressure by using the same apparatus.
Figure 5A:
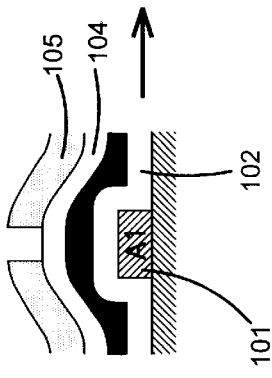
FIGS. 5(a) through FIG. 5(g) show processes for flattening in accordance with a conventional art.
Figure 5B:
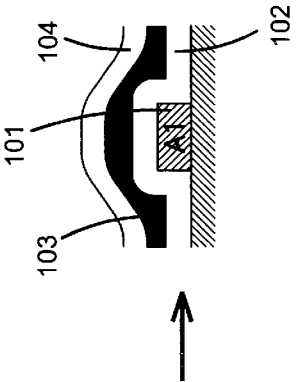
Figure 5C:
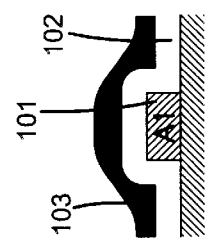
Figure 5D:
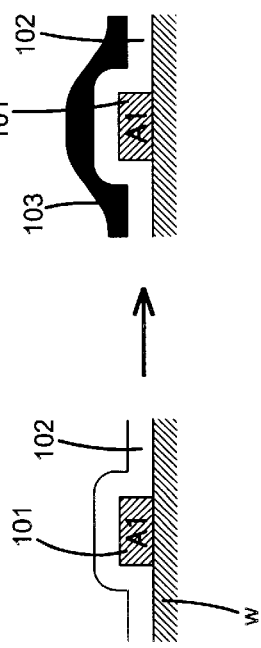
Figure 5E:
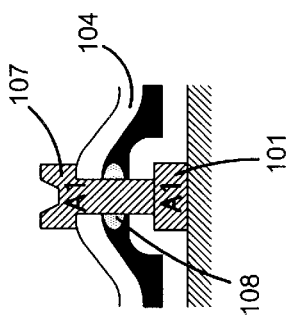
Figure 5F:
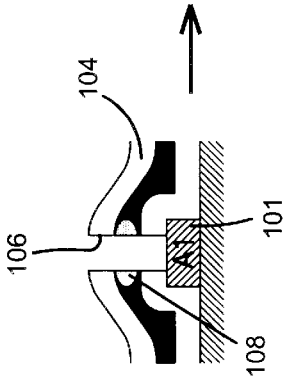
Figure 5G:
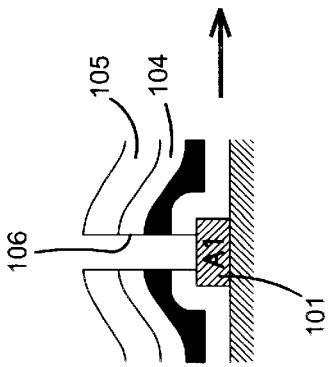
Figure 6A:
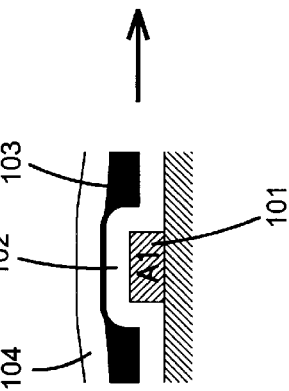
FIGS. 6(a) through FIG. 6(f) show processes of etching back in accordance with a conventional art.
Figure 6B:
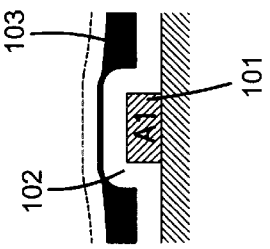
Figure 6C:
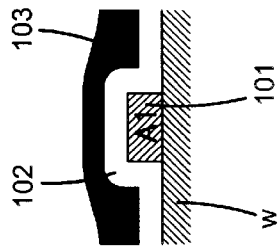
Figure 6D:
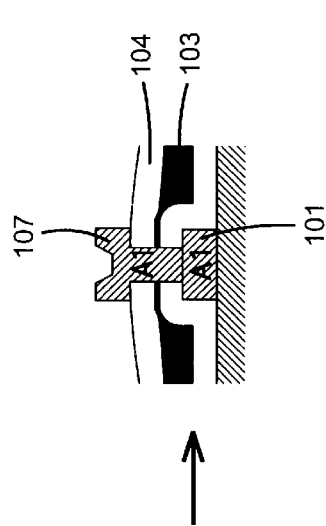
Figure 6E:
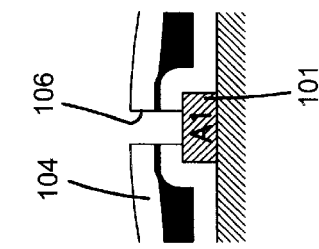
Figure 6F:
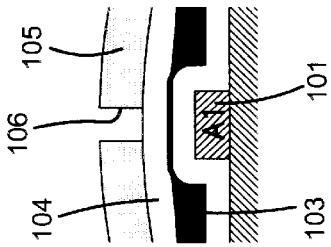

On the other hand, FIG. 4(b) shows the infrared absorption spectrum which is obtained through the ashing process for 30 seconds by using the same plasma ashing apparatus, under the atmospheric pressure at 35 Torr, though the same condition as mentioned above is applied until forming the via hole by treating the etching process. From this drawing, it is apparent that N—H bonding is broken if the pressure during the ashing process becomes high, and OH bonding is caused.

As is fully explained in the above, in accordance with the present invention, decomposition or resolution of the organic group (for example, the methyl group ($CH_3$), etc.) bonded to the Si atom of the organic SOG film can be suppressed, and as a result, the phenomenon called "poisoned via" will not occur during the ashing of the resist film. Consequently, it can be completed or achieved without the etching back process, thereby simplification of the process can be obtained. Further, the similar effect can be obtained from the SOG film which is formed from the coating liquid containing the polysilazane.

Moreover, since it can be completed or achieved without the etching back process, there is no possibility that the lower layer wiring is removed during the etching back process, thereby being able to cope with further miniaturized pattern.

What is claimed is:

1. A method for forming multi-layer wiring structure, wherein a lower wiring layer and an upper wiring layer are electrically connected through a via hole, comprising following steps:

forming an organic SOG layer from a coating liquid directly or through a predetermined film including a hillock protection layer on said lower wiring layer wherein the coating liquid for forming said organic SOG layer includes hydrolysis-and-condensation product which is obtained by reacting moanoalkyltrialkoxysilane of 0.5 through 4 mol upon tetraalkoxysilane of 1 mol.;

forming said upper wiring layer on said organic SOG layer without processing of etching back;

forming a via hole through etching process by using a patterned resist layer provided on said upper wiring layer as a mask;

conducting ashing process to remove said patterned resist layer with a plasma by making ion or radical which is induced from oxygen gas as a main reactant, under an atmosphere of pressure of about 0.01 Torr; and burying said via bole with a conductive body so as to electrically connect between said lower wiring layer and said upper wiring layer.

2. A method for forming multi-layer wiring structure, wherein a lower wiring layer and an upper wiring layer are electrically connected through a via hole, comprising following steps:

forming an organic SOG layer from a coating liquid directly or through a predetermined film including a hillock protection layer on said lower wiring layer wherein the coating liquid for forming said organic SOG layer includes hydrolysis-and-condensation product which is obtained by reacting tetraalkoxysilane of 0.5 through 4 mol and monoalkyltrialkoxysilane of 0.5 through 4 mol upon dialkyldialkoxysilane of 1 mol.;

forming said upper wiring layer on said organic SOG layer without processing of etching back, forming a via hole through etching process by using a patterned resist layer provided on said upper wiring layer as a mask;

conducting ashing process to remove said patterned resist layer with a plasma by making ion or radical which is induced from oxygen gas as a main reactant, under an atmosphere of pressure of about 0.01 Torr, and burying said via hole with a conductive body so as to electrically connect between said lower wiring layer and said upper wiring layer.

3. A method for forming multi-layer wiring structure, wherein a lower wiring layer and an upper wiring layer are electrically connected through a via hole, comprising following steps:

forming an organic SOG layer from a coating liquid directly or through a predetermined film including a hillock protection layer on said lower wiring layer wherein the coating liquid for forming said organic SOG layer includes ladder-type hydrolysis-and-condensation product which is obtained from monoalkyltrialkoxysilane;

forming said upper wiring layer on said organic SOG layer without processing of etching back;

forming a via hole through etching process by using a patterned resist layer provided on said upper wiring layer as a mask;

conducting ashing process to remove said patterned resist layer with a plasma by making ion or radical which is induced from oxygen gas as a main reactant, under an atmosphere of pressure of about 0.01 Torr; and burying said via hole with a conductive body so as to electrically connect between said lower wiring layer and said upper wiring layer.

* * * * *